United States Patent [19]

Poli et al.

[11] Patent Number: 4,744,594

[45] Date of Patent: May 17, 1988

[54] VACUUM HANDLING ESPECIALLY FOR THE USE IN HANDLING SILICON WAFERS

[75] Inventors: Bernard Poli, Roche La Moliere; Gérard Chincholle, Saint Etienne, both of France

[73] Assignee: RECIF (Societe Anonyme), France

[21] Appl. No.: 940,535

[22] Filed: Dec. 10, 1986

[30] Foreign Application Priority Data

Dec. 10, 1985 [FR] France ............................. 85 18635
Nov. 12, 1986 [FR] France ............................. 86 16186

[51] Int. Cl.$^4$ ............................................. B25J 15/06
[52] U.S. Cl. ............................................. 294/64.1
[58] Field of Search .................... 294/64.1–64.3; 137/613, 614.19; 251/319, 321; 269/21; 271/108

[56] References Cited

U.S. PATENT DOCUMENTS

| 954,927 | 4/1910 | Burdick | 294/64.1 |
|---|---|---|---|
| 1,302,028 | 4/1919 | Fuchs et al. | 294/64.1 |
| 1,542,015 | 6/1925 | Strickland | 251/321 X |
| 3,071,402 | 1/1963 | Lasto et al. | 294/64.1 |
| 3,335,727 | 8/1967 | Spoto | 294/64.1 X |
| 4,212,300 | 7/1980 | Meals | 251/321 X |

FOREIGN PATENT DOCUMENTS

| 58589 | 5/1977 | Japan | 294/64.1 |
|---|---|---|---|
| 39874 | 4/1978 | Japan | 294/64.1 |
| 33678 | 3/1979 | Japan | 294/64.1 |
| 6385 | of 1909 | United Kingdom | 294/64.1 |
| 248952 | 7/1969 | U.S.S.R. | 294/64.1 |

*Primary Examiner*—Johnny D. Cherry
*Attorney, Agent, or Firm*—Eric P. Schellin

[57] ABSTRACT

The object of this invention relates to the technical sector of microelectronics.

The vacuum handling system according to the invention comprises a hollow body (1) of which the end takes the gripping tip forming an inside chamber (1b) with at least two annular grooves (1b1) and (1b2) for the positioning of two O rings (7) of a soft deformable material to insure, on the one hand the dismantable assembling of the part corresponding to the tip, and, on the other hand, the vacuum tightness.

4 Claims, 2 Drawing Sheets

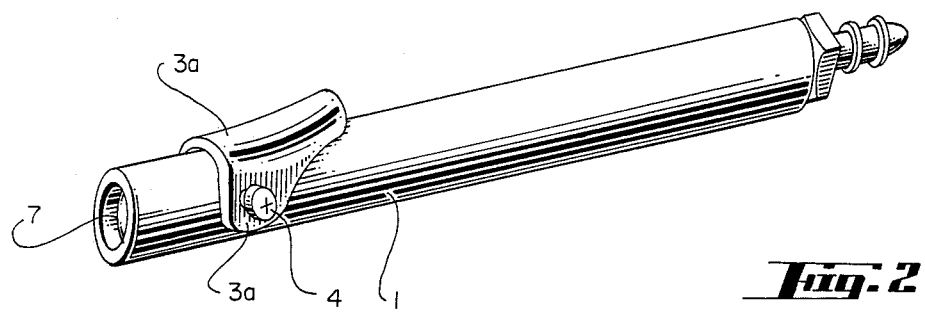
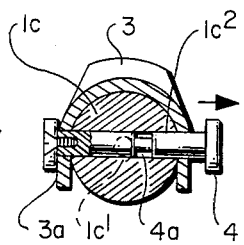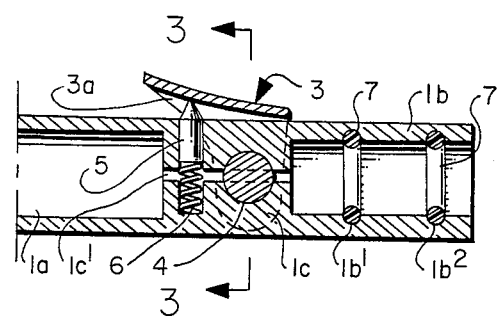
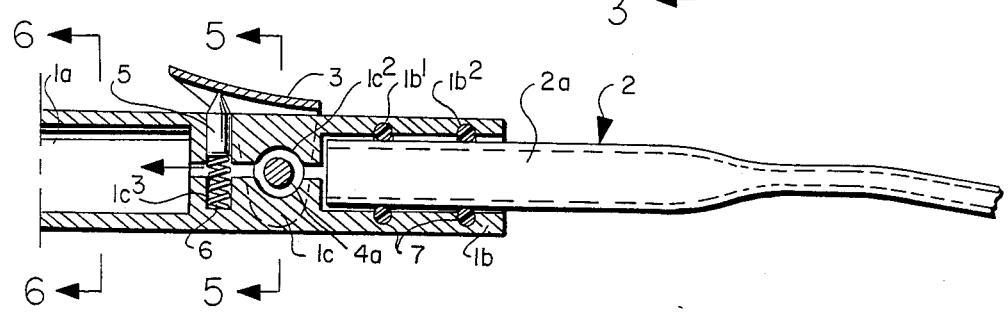
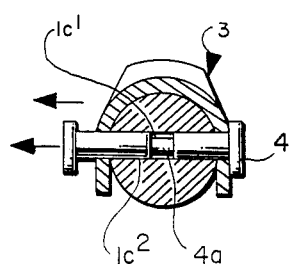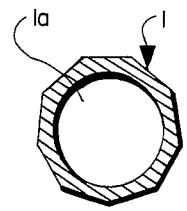

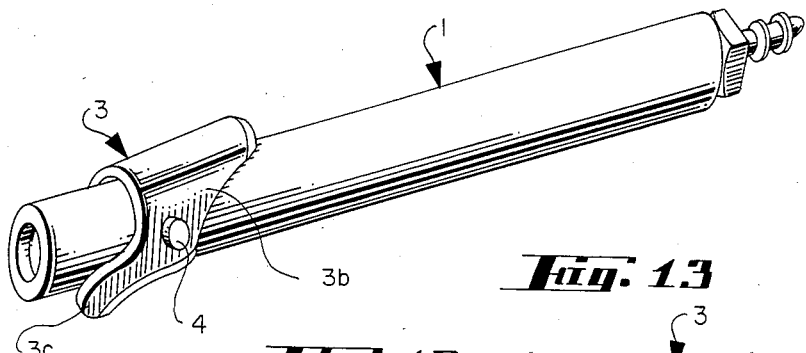
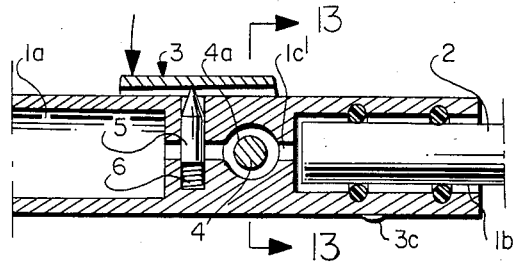
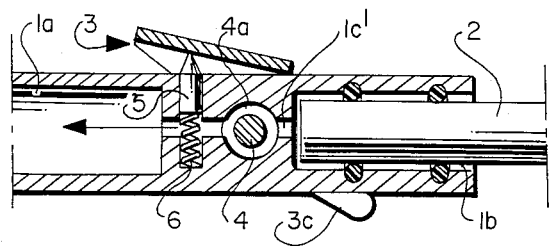
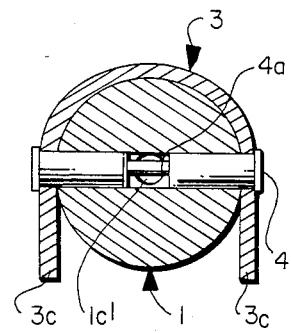
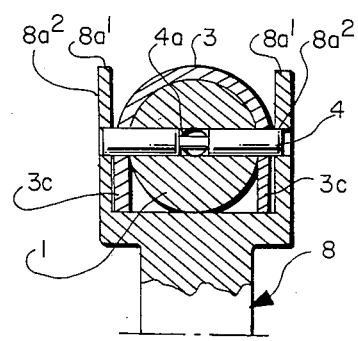
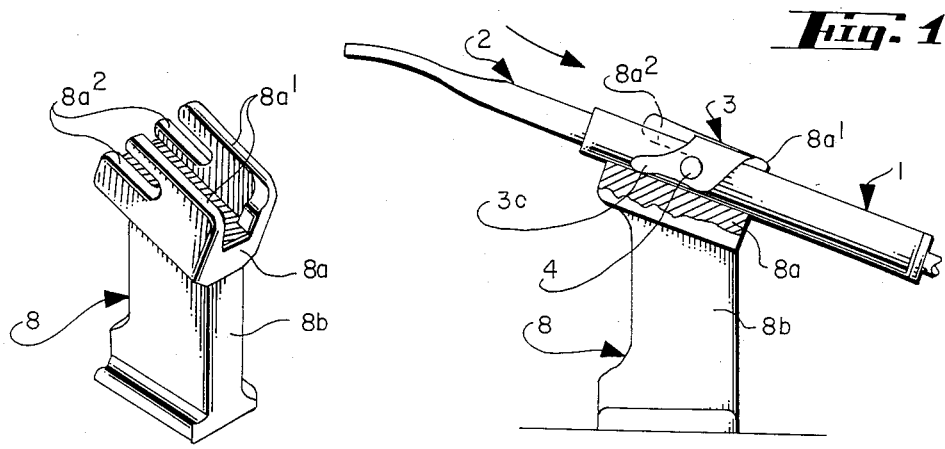

VACUUM HANDLING ESPECIALLY FOR THE USE IN HANDLING SILICON WAFERS

Vacuum handling machine especially for the use in handling silicon wafers. This invention relates to the technical sector of mico-electronics.

The use of vacuum handling systems for the handling of silicon wafers is known. In general, these vacuum handling systems are connected to a vacuum pump and are designed at their opposite end to take a gripping tip formed so as to retain the wafer by suction. The body of these vacuum handling systems is in addition provided with a control element for submitting or not the tip to the vacuum action. These vacuum handling systems present certain disadvantages with respect to their design.

One disadvantage appears with regards to the limited capacity of the body of the vacuum handling systems, so reducing the vacuum storage and consequently, the intensity of the suction force. In the same way, the control element for initiating a vacuum is not always very rational and easily releasable. It results in delicate manipulations.

The object of this invention is to remedy these disadvantages, in a simple and efficient manner by providing an ergonomical vacuum handling system, determined to provide a satisfactory grip by hand whilst the control element allows a quick vacuum initiation.

The body of the vacuum handling system is in addition, formed to facilitate the quick tip changing whilst securing their holding and tightness properties. According to the invention, the vacuum handling system is of a type comprising a hollow body designed at one of its ends to be connected to a pump and at its other end, a gripping tip, the said body being in addition, equipped with a control element to provide at will the vacuum initiation, whilst the end of the body, which takes the gripping tip, forms an inside chamber.

According to a first feature, the inside chamber is separated from a hollow back part which acts as a vacuum storage room, by a solid part with an axial communicating hole, the said solid part taking the control element by a digitally activated pusher and hinged on a pin, transversally mounted in the thickness of the solid part of the body with limited translatory movement to plug or not, to specific means, the communicating hole, the said hole can be plugged at will by a piston fixed to an elastic element and can be activated by the pivoting of the pusher around its pin.

According to another feature, the push button is suitably profiled to cooperate with the additional support forms with a view to activating the automatic tipping of the pusher corresponding to the closing position.

The wings of the push button are extended by two profiled angular arms which cooperate with notches formed on the parallel sides of a slanting support head.

This solution allows the automatic vacuum cut out when the vacuum handling system rests on its support.

In order to clarify the object of the invention, however without limiting it, the invention is illustrated by the accompanying drawings, in which:

FIG. 1 is a perspective view of the vacuum handling system,

FIG. 2 is a longitudinal sectional view of the vacuum handling system in the rest position, not showing the tip, FIG. 3 is a cross sectional view taken on the line 3—3 of FIG. 2, the FIG. 4 is a view corresponding to FIG. 2 in working position, with the tip mounted, the FIG. 5 is a cross sectional view taken on the line of 5—5 of FIG. 4, FIG. 6 is a cross sectional view taken on the line of 6—6 of FIG. 4, FIG. 7 is a perspective view of the vacuum handling system and according to another embodiment, FIG. 8 is a perspective view of the vacuum handling system support according to FIG. 7, the FIG. 9 shows the vacuum handling system positioned on its support, the FIG. 10 is a partial sectional view showing the digital pressure applied to the pusher element to interrupt the vacuum action, FIG. 11 is a view corresponding to FIG. 10, no pressure is applied to the pusher which corresponds to the use of the vacuum handling system, the FIG. 12 is a partial sectional view showing the vacuum handling system positioned on its support in the closed position, the FIG. 13 is a cross sectional view on a larger scale, taken on the line 13—13 of the FIG. 10.

The vacuum handling system comprises a hollow body (1) with: a back part (1a) which acts as a vacuum storage room and a front part (1b) of reduced dimension, designed to take a gripping tip (2) making up a tight inside chamber. The two parts (1a) and (1b) are separated by a solid part (1c) and put into communication through an axial hole (1c1) pluggable at will by a control element (3) to draw or not the vacuum. In a known manner, the back part (1a) is designed to be coupled to a vacuum pump.

The bore of the front part (1b) is provided with two annular grooves (1b1) and (1b2) for the positioning of O rings (7). The two O rings are suitably spaced to insure in combination, on the one hand, the dismantable assembling of a corresponding inserted section (2a) of the tip (2) and, on the other hand, the vacuum tightness (FIG. 4).

The tips (2) can thus be easily changed and turned in a horizontal plane over 360 degrees as is convenient to the operator without altering the mounting and tightness characteristics. It is emphasized that this method of tight assembly is compatible with all tip types, including metal and quartz, of which the ends are determined.

As shown, this tight front chamber (1b) is put in communication with the back storage room (1a) through the axial hole (1c1) pluggable or not by the element (3).

With this object, the element (3) is provided in the form of a pusher (3a) hinged on a pin (4). In the embodiment illustrated in FIGS. 1 to 6, the pin (4) is mounted with limited translatory movement in the bore (1c2) transversally formed in the thickness of the solid part (1c) of the body and in communication with the hole (1c1). This pin (4) is provided with a central groove (4a) which can be positioned in front of the hole (1c1) by movement of the said pin which corresponds, depending on the case, to the plugging or not of the said hole and consequently putting or not the two chambers (1a) and (1b) into communication.

The pusher (3a) is, on the other hand, likely to control, when pivoting around its pin (4), a vertical piston (5) controlled by an elastic element (6). This piston slides freely in a blind hole (1c3) formed perpendicularly to the hole (1c1) so as the said piston is positioned in front or not of the said hole (1c1) according to whether or not there is pressure applied to the pusher. In the rest position, with no activation of the pusher (3a). The piston is situated above the communicating hole (1c1).

The operating of the vacuum handling system is as follows: After having inserted the tip (2) in the tight chamber (1b) in combination with the O rings (7), the pin (4) is transversally moved to put the groove (4a) into communication with the hole (1c1), so that the tip (2) is subjected to the vacuum action, which corresponds to the working position, for example, to grip a wafer. In this position, the pusher (3) is not submitted to pressure, so that the piston (5) does not plug the hole (1c1).

If pressure is applied to the pusher (3a), the piston (5) is driven in order to plug the hole (1c1) and thus, cut out the vacuum in front of the tip (2). Therefore, a quick actuation of vacuum arises, the vacuum handling system can be gripped by one hand during the operation.

In an interesting manner, as FIG. 6 shows, the inside section of the back part (1a) which acts as a vacuum storage room, is completely circular, thus increasing its capacity. Flat parallel areas (1a1) are regularly distributed on the external periphery of the circumference and along the generating lines, to insure a good manual gripping of the vacuum handling system. For example, the external section of the body of the vacuum handling system, at the level of its gripping part, has an octagonal section. In the embodiment illustrated in FIGS. 7 to 13, the pusher (3) is designed in combination with a support element (8) to automatically secure the actuation and interruption of the vacuum. In this embodiment, the pin is no longer mobile laterally.

The wings (3b) of the pusher (3) which surround the body section (1) of the vacuum handling system, are extended in a downward direction by profiled angular arms (3c) likely to cooperate with support forms and additional centering elements of the support element (8) destined to take the vacuum handling system. With this object, the support element (8) is provided with a slanted support head (8a) forming two parallel vertical wings (8a1) between which the body of the vacuum handling system (1) is inserted.

Each wing (8a1) has a notch (8a2) formed at each of its ends so as to insert the profiled angular arms (3c) of the pusher element. As the arms (3c) are inserted into the notches, taking into account their profile, the notches cause the angular tipping of the pusher (3) around its pin (4) so that the piston (5) is moved to the plugging position (FIG. 12).

It is to be emphasised that the support head (8a) is suitably slanted and the notches suitably determined in combination with the profiles of the angular arms (3c) and the setting of the spring (6), so that, once there is insertion of the said arms, the vacuum handling system is automatically positioned, by gravity (FIG. 9). The notches (8a2) are parallel to the slanted support surface (8c) of the head (8a).

The slanted support head (8a) of the support is formed in the end of a vertical leg (8b) designed to be placed on its working plane possibly being fixed by screws for example.

We claim:

1. An elongated tubular holder for silicon wafers and the like comprising an elongated hollow tube, said tube being opened at one end and defining a socket portion and a hollow portion at the other end, a solid means separating said socket portion and said hollow portion, said hollow portion having means whereby to connect it to a vacuum source to produce diminished gas pressure in said hollow portion, said solid means having an axial bore therethrough thereby connecting said socket portion and said hollow portion, a first transverse bore completely through said solid means intersects said axial bore, a reciprocable elongated means positioned in said first transverse bore having a plug portion to selectively completely interrupt said axial bore, said reciprocable elongated means having at each end axle means extending beyond said first transverse bore, a second transverse bore in said solid means axially displaced from said first transverse bore which intersects said axial bore, a movable plug positioned in said second transverse bore to selectively completely interrupt said axial bore, spring means operatively connected to said plug to urge said plug in a radial direction externally of said second transverse bore, a lever means, said lever means manually operatively articulated to impinge on said plug extending from said second transverse bore, said lever means being pivotally mounted on said axle means, said lever means when manually depressed in the direction of the solid means thrusts said plug in a manner to interrupt said axial bore.

2. The elongated tubular holder for silicon wafers and the like of claim 1 including ear extensions on each side of said lever means beyond the pivotal mount on said axle means and said lever means has a U-shaped configuration with the underside of the portion connecting the legs of the U-shaped lever means in operative contact with an end of said plug.

3. The elongated tubular holder for silicon wafers and the like of claim 2 wherein second transverse bore is a blind end bore and said spring means is positioned between said blind end and one end of said plug.

4. The elongated tubular holder for silicon wafers and the like of claim 2 wherein the holder is mounted at an angle from the horizontal in a support means, said support means having oblique slots adapted and constructed to actuate said lever means through said ear extensions whereby to have said plug interrupt said axial bore.

* * * * *